(12) United States Patent
Chin et al.

(10) Patent No.: US 9,857,532 B2
(45) Date of Patent: Jan. 2, 2018

(54) SEMICONDUCTOR DEVICE PACKAGES

(71) Applicant: Advanced Semiconductor Engineering, Inc., Kaohsiung (TW)

(72) Inventors: Yi-Min Chin, Kaohsiung (TW); Jia-Hao Zhang, Kaohsiung (TW); Chi-Han Chen, Kaohsiung (TW); Mei-Ju Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/406,509

(22) Filed: Jan. 13, 2017

(65) Prior Publication Data

US 2017/0336561 A1 Nov. 23, 2017

Related U.S. Application Data

(60) Provisional application No. 62/338,993, filed on May 19, 2016, provisional application No. 62/341,555, filed on May 25, 2016.

(51) Int. Cl.
*G02B 6/12* (2006.01)
*G02B 6/122* (2006.01)
*H01L 31/167* (2006.01)

(52) U.S. Cl.
CPC ............ *G02B 6/122* (2013.01); *H01L 31/167* (2013.01)

(58) Field of Classification Search
CPC ........... G02B 6/43; G02B 5/10; G02B 6/4245
See application file for complete search history.

(56) References Cited

U.S. PATENT DOCUMENTS

| | | | | |
|---|---|---|---|---|
| 6,331,382 | B1* | 12/2001 | Robertsson | G02B 6/122 |
| | | | | 219/121.68 |
| 8,798,410 | B2* | 8/2014 | Feng | G02B 6/423 |
| | | | | 257/E33.077 |
| 8,975,672 | B2* | 3/2015 | Chiang | H01L 21/28518 |
| | | | | 257/288 |
| 9,323,014 | B2* | 4/2016 | Levy | G02B 6/425 |
| 9,482,831 | B2* | 11/2016 | Zhou | G02B 6/4257 |
| 9,484,482 | B2* | 11/2016 | Hsu | G02B 6/4214 |
| 9,543,208 | B2* | 1/2017 | Schmenn | H01L 21/765 |
| 9,606,231 | B2* | 3/2017 | Halbritter | G01S 17/08 |
| 2013/0320567 | A1* | 12/2013 | Thacker | H01L 25/0652 |
| | | | | 257/777 |
| 2013/0330035 | A1* | 12/2013 | Shin | G02B 6/12 |
| | | | | 385/14 |
| 2015/0036970 | A1* | 2/2015 | Lai | G02B 6/13 |
| | | | | 385/14 |
| 2015/0234137 | A1* | 8/2015 | Kuo | G02B 6/4259 |
| | | | | 385/14 |

* cited by examiner

*Primary Examiner* — Ellen Kim
(74) *Attorney, Agent, or Firm* — Foley & Lardner LLP; Cliff Z. Liu

(57) ABSTRACT

A semiconductor device includes a substrate, a passivation layer and an optical element. The substrate includes a surface and a sidewall. The passivation layer is disposed on the surface of the substrate. The optical element is disposed in the substrate and exposed from the sidewall of the substrate. The sidewall of the substrate is inclined towards the surface of the substrate at an angle of approximately 87 degrees to approximately 89 degrees.

26 Claims, 6 Drawing Sheets

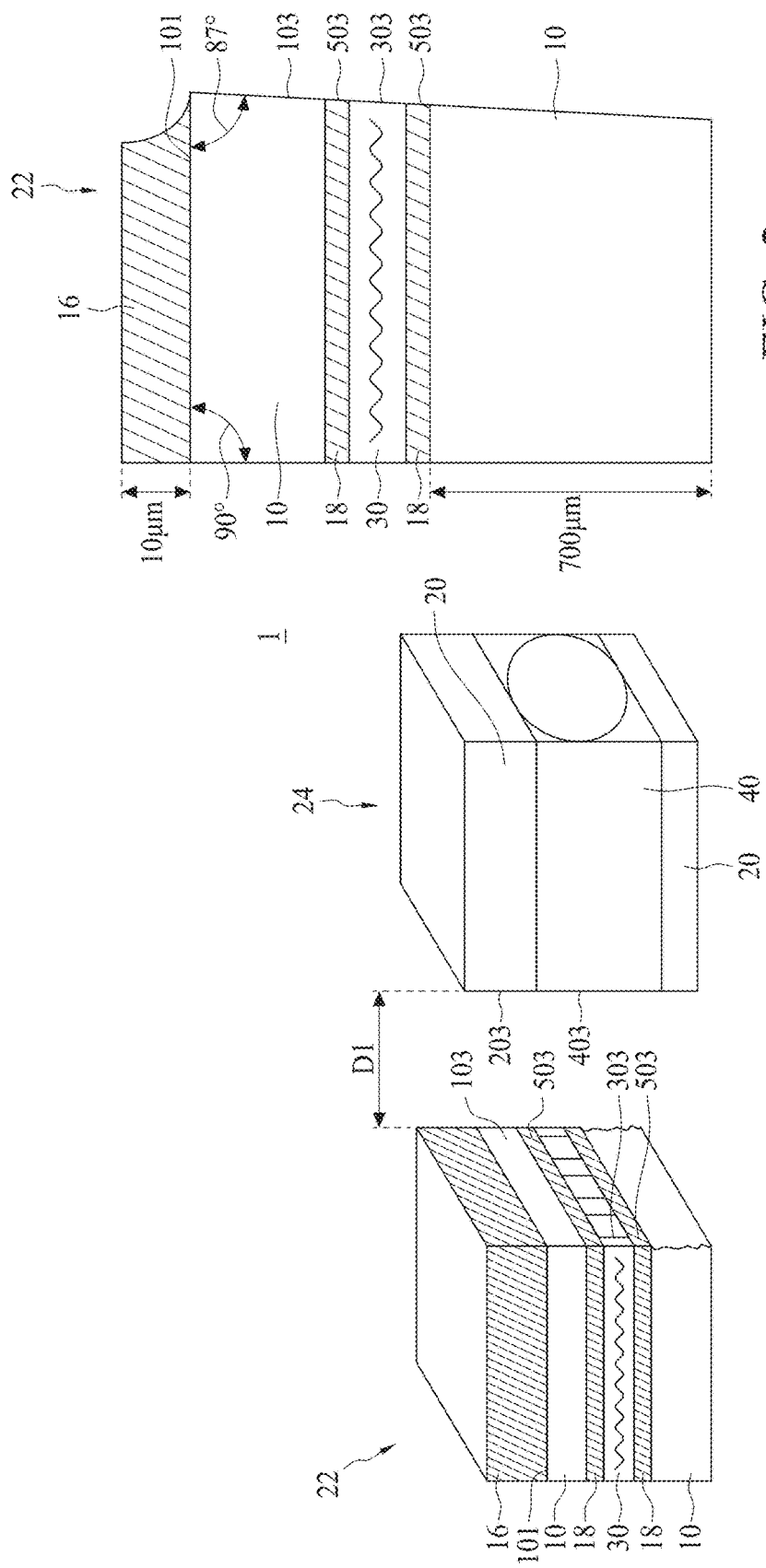

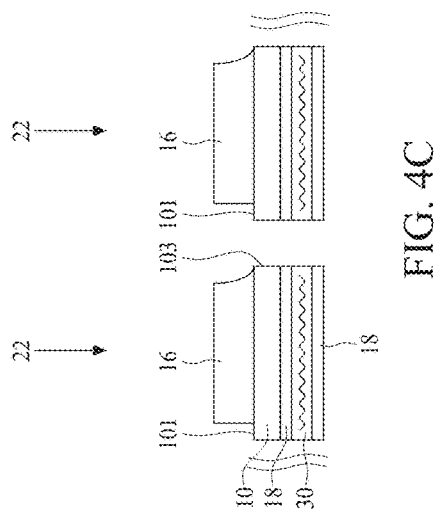
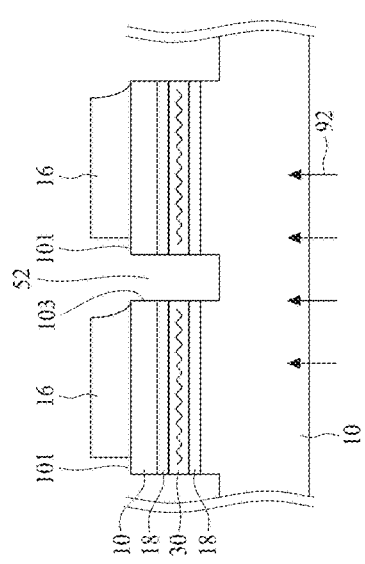

SEMICONDUCTOR DEVICE PACKAGES

CROSS-REFERENCE TO RELATED APPLICATIONS

This application claims the benefit of and priority to U.S. Provisional Application No. 62/338,993, filed 19 May 2016, and U.S. Provisional Application No. 62/341,555, filed 25 May 2016, the contents of which are incorporated herein by reference in their entireties.

BACKGROUND

1. Technical Field

The present disclosure relates to a semiconductor device package. In particular, the present disclosure relates to a semiconductor device package including optical devices.

2. Description of the Related Art

In comparable optical devices, a waveguide can be used to guide light from a light emitter to an optical sensor in a semiconductor device package. However, distance between a light emitter and an optical sensor may result in lower optical transmission efficiency and lower accuracy of a coupling facet.

A comparable manufacturing process includes singulating or cutting a wafer including a waveguide into a plurality of optical devices by using a blade saw. However, an uneven sidewall of each optical device may degrade quality of light transmission when integrating or coupling the optical device to an optical fiber or laser diode. One approach to address the above problem may be to polish the sidewall of the optical devices and to subsequently coat an anti-reflection film on the sidewall. However, cost of a manufacturing process would increase and the process would become more complicated.

SUMMARY

In some embodiments, a semiconductor device includes a substrate, a passivation layer and an optical element. The substrate includes a surface and a sidewall. The passivation layer is disposed on the surface of the substrate. The optical element is disposed in the substrate and exposed from the sidewall of the substrate. The sidewall of the substrate is inclined towards the surface of the substrate at an angle of approximately 87 degrees to approximately 89 degrees.

In some embodiments, a semiconductor device package includes a first optical device and a second optical device. The first optical device includes a first substrate including a first surface and a first sidewall, a passivation layer on the first surface of the first substrate, and a first optical element in the first substrate and exposed from the first sidewall of the first substrate, the first optical element comprising a sidewall. The second optical device includes a second substrate including a second sidewall, a second optical element in the second substrate and exposed from the second sidewall of the second substrate, the second optical element comprising a sidewall. A lateral distance between the first sidewall of the first optical element of the first optical device and the second sidewall of the second optical element of the second optical device is less than about 2 micrometers (μm).

In some embodiments, a semiconductor wafer includes a semiconductor body, a passivation layer and a trench. The semiconductor body includes a surface and a plurality of optical devices, wherein each of the plurality of optical devices includes a plurality of edges. The passivation layer is disposed on each of the optical devices. The trench corresponds to each of the plurality of optical devices and is recessed from the first surface of the semiconductor body, and the trench is adjacent to one of the plurality of edges of each of the optical devices.

In some embodiments, a semiconductor device includes a substrate, a passivation layer and an optical element. The substrate includes a surface and a sidewall. The passivation layer is disposed on the surface of the substrate. The optical element is disposed in the substrate and is exposed from the sidewall of the substrate. The passivation layer includes a curved sidewall adjacent to the sidewall of the substrate.

BRIEF DESCRIPTION OF THE DRAWINGS

FIG. 1 is a perspective view of a semiconductor device package in accordance with some embodiments of the present disclosure.

FIG. 2 is a cross-sectional view of a semiconductor device in accordance with some embodiments of the present disclosure.

FIG. 4A, FIG. 4B and FIG. 4C illustrate a method of manufacturing a semiconductor device in accordance with some embodiments of the present disclosure.

Common reference numerals are used throughout the drawings and the detailed description to indicate the same or similar elements. Embodiments of the present disclosure will be more apparent from the following detailed description taken in conjunction with the accompanying drawings.

DETAILED DESCRIPTION

Figure 3:
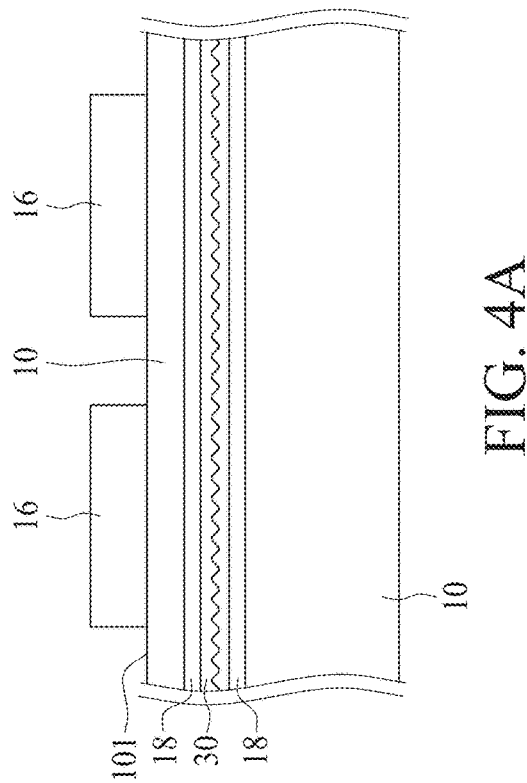
FIG. 3 is an example of an inclined structure in accordance with some embodiments of the present disclosure.

Described in the present disclosure are optical devices according to some embodiments having improved quality of light transmission. Moreover, the optical devices according to some embodiments may reduce the large distances between a light emitter and an optical sensor that lower optical transmission efficiency and lower accuracy of a coupling facet.

Spatial descriptions, such as "above," "below," "up," "left," "right," "down," "top," "bottom," "vertical," "horizontal," "side," "higher," "lower," "upper," "over," "under," and so forth are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

FIG. 1 is a perspective view of a semiconductor device package 1 in accordance with some embodiments of the present disclosure. The semiconductor device package 1 includes two optical devices 22 and 24. The optical device 22 includes a substrate (or first substrate) 10, an optical element (or first optical element) 30, a passivation layer 16 and a semiconductor oxide layer 18. The substrate 10 may include, for example, silicon (Si) or one or more other suitable materials. The passivation layer 16 may include, for example, silicon dioxide ($SiO_2$), or one or more other suitable materials. The semiconductor oxide layer 18 may include, for example, silicon oxide ($SiO_x$), or one or more other suitable materials. The optical element 30 may be a waveguide. The optical element 30 may include, for example, Si or one or more other suitable materials. A thickness of the optical element 30 may be less than about 10 micrometers (μm).

The optical device 24 includes a substrate (or second substrate) 20 and an optical element (or second optical element) 40. The substrate 20 may include, for example, Si or one or more other suitable materials. The optical element 40 may be an optical fiber, laser diode or other suitable element. The laser diode or optical fiber of the optical element 40 may be optically coupled to the optical element 30 (e.g., waveguide). The optical device 24 may be suspended on the substrate 20. The optical device 24 may be latched on the substrate 20.

The substrate 10 includes a surface (or first surface) 101 and a sidewall (or first sidewall) 103. The passivation layer 16 is disposed on the surface 101 of the substrate 10. The optical element 30 includes a sidewall 303. The sidewall 303 of the optical element 30 is continuous with and substantially coplanar with the sidewall 103 of the substrate 10. A shape of an opening of the optical element 30 at the sidewall 303 is a square or rectangle. A roughness of the sidewall 103 of the substrate 10 may be less than about 1.5 such as about 1.4 μm or less, about 1.2 μm or less, or about 1 μm or less in terms of root-mean-square surface roughness.

The semiconductor oxide layer 18 includes a sidewall 503. The substrate 20 includes a sidewall (or second sidewall) 203. The optical element 40 includes a sidewall 403. A distance D1 is defined between the sidewall 303 of the optical element 30 and the sidewall 403 of the optical element 40. The distance D1 between the exposed portion of the first optical device 22 and the exposed portion of the second optical device 24 may be less than about 2 such as about 1.9 μm or less, about 1.8 μm or less, or about 1.7 μm or less.

FIG. 2 is a cross-sectional view of a semiconductor device (e.g., optical device 22) in accordance with some embodiments of the present disclosure. The optical element 30 of the optical device 22 is disposed in the substrate 10 and exposed from the first sidewall 103. In some embodiments, the first sidewall 103 is inclined or curved towards the first surface 101 at an angle of less than 90 degrees or approximately 87 degrees to approximately 89 degrees. In some embodiments, the passivation layer 16 includes a curved sidewall adjacent to the first sidewall 103. A thickness of the substrate 10 (e.g., a particular layer of the substrate 10) may be greater than about 400 μm and a thickness of the passivation layer 16 may be about 10 μm to about 15 μm.

FIG. 3 is an example of an inclined structure in accordance with some embodiments of the present disclosure. As shown in FIG. 3, the angle of the upper corner of the inclined structure may be approximately 87 degrees to approximately 89 degrees.

Figure 4A:
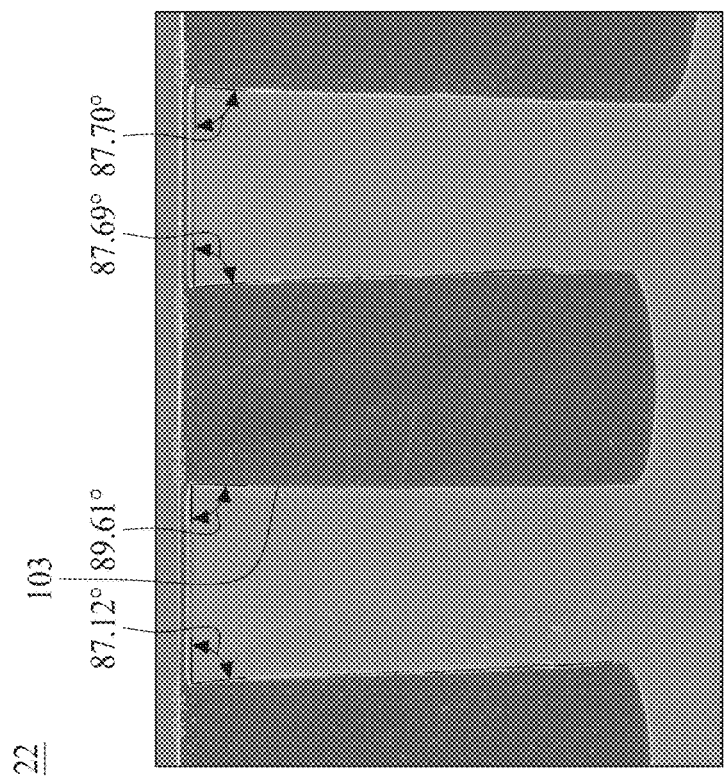

FIGS. 4A, 4B and 4C illustrate a method of manufacturing a semiconductor device (e.g., optical device 22) in accordance with some embodiments of the present disclosure. Referring to FIG. 4A, a semiconductor body (e.g., substrate) 10 is provided. The semiconductor body 10 may include, for example, Si or one or more other suitable materials. The patterned passivation layer 16 is formed on the first surface 101 of the semiconductor body 10. The optical element 30 and the semiconductor oxide layer 18 are formed in the semiconductor body 10. The semiconductor oxide layer 18 may include, for example, $SiO_x$ or one or more other suitable materials. The optical element 30 may include, for example, Si or one or more other suitable materials. A warpage of the semiconductor body 10 may be about 5 μm to about 10 μm.

Referring to FIG. 4B, the semiconductor body 10 and a portion of the passivation layer 16 are etched (e.g., using Deep Reactive Ion Etching (DRIE)). After etching, the passivation layer 16 includes a curved sidewall adjacent to the first sidewall 103. A trench 52 is recessed from the first surface 103 of the semiconductor body 10. The first surface 103 is exposed within the trench 52. Next, a backside grinding 92 is performed to reduce a thickness of the semiconductor body 10.

Referring to FIG. 4C, then, a portion of the semiconductor body 10 is removed from the bottom surface of the semiconductor body 10, such as by backside grinding 92, until the trench 52 penetrates fully through the semiconductor body 10 such that the optical devices 22 are singulated to form individual optical device 22 as shown in FIG. 1 and FIG. 2. The optical devices 22 are separated using the backside grinding. In some embodiments, the backside grinding may be performed by using a rotatable polishing pad. The first surface 101 of the semiconductor body 10 is partially covered by the passivation layer 16 and the semiconductor body 10 thus includes a protruding portion not covered by the passivation layer 16.

Using DRIE in the manufacturing process may reduce steps of the manufacturing process and accordingly the roughness of the first sidewall 103 of the substrate 10 may be less than about 1.5 μm. In addition, using this manufacturing process, the distance D1 between the sidewall 303 of the optical element 30 and the sidewall 403 of the optical element 40 may be reduced to be less than about 2 μm.

Figure 5B:
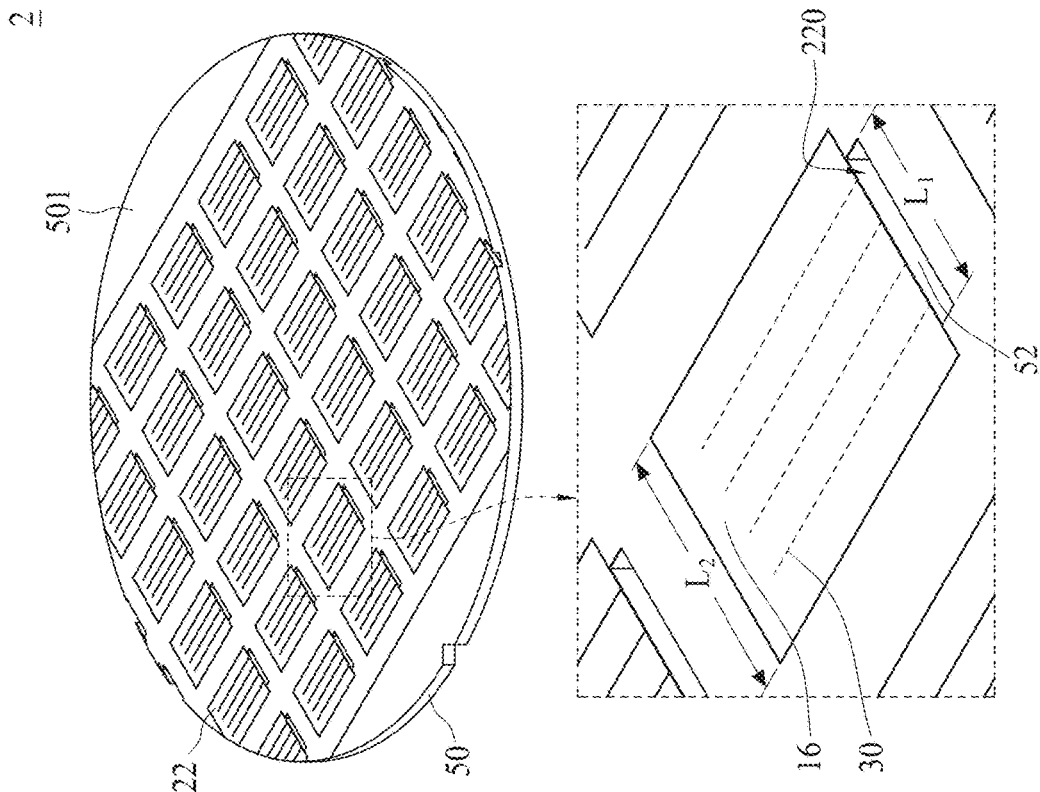
FIG. 5A and FIG. 5B are side-sectional views of a semiconductor wafer in accordance with some embodiments of the present disclosure.
Figure 5A:
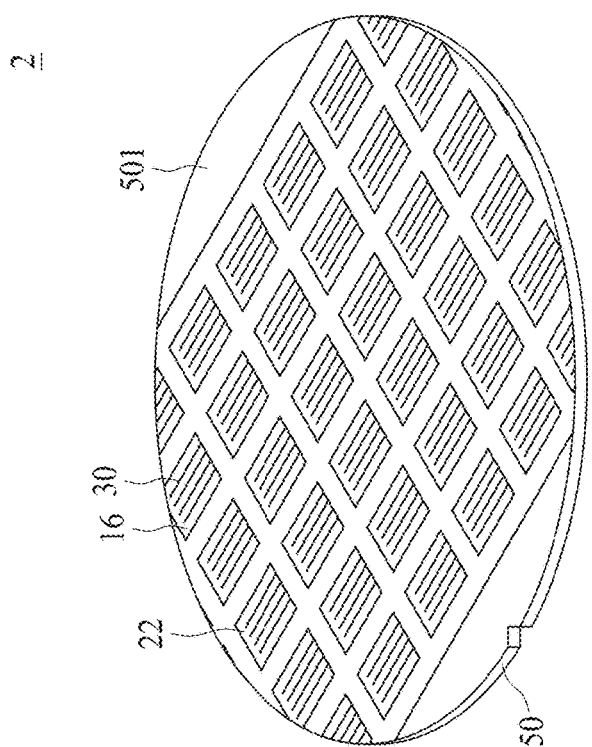

FIGS. 5A and 5B are side-sectional views of a semiconductor wafer 2 in accordance with some embodiments of the present disclosure. Referring to FIG. 5A, the semiconductor wafer 2 is shown prior to singulation. The semiconductor wafer 2 includes a surface 501 and a plurality of optical devices 22. Each of the plurality of optical devices 22 includes a plurality of edges. A plurality of passivation layers 16 are disposed on each of the optical devices 22. The passivation layer 16 includes the curved sidewall.

Referring to FIG. 5B, the trench 52 is recessed from a first surface 501 of a semiconductor body 50. An opening 220 of the trench 52 includes a plurality of edges, and one of the plurality of edges of the opening 220 has a length $L_1$. One of the edges of the optical devices 22 has a length $L_2$. The trench 52 is adjacent to one of the plurality of edges of each of the optical devices 22. The trench 52 passes through or penetrates through the semiconductor body 50. The length $L_1$ of the opening 220 of the trench 52 may be equal to or less than the length $L_2$ of the edge of the optical devices 22. The optical devices 22 are separated after the backside grinding 92 is performed (e.g., by using a rotatable polishing pad).

Figure 5C:
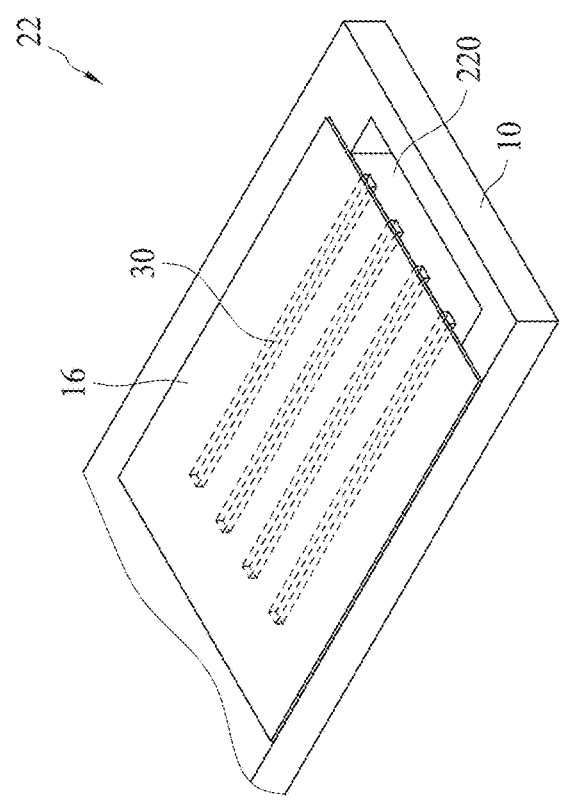
FIG. 5C and FIG. 5D are side-sectional views of the semiconductor device shown in FIG. 5B in accordance with some embodiments of the present disclosure.
Figure 5D:
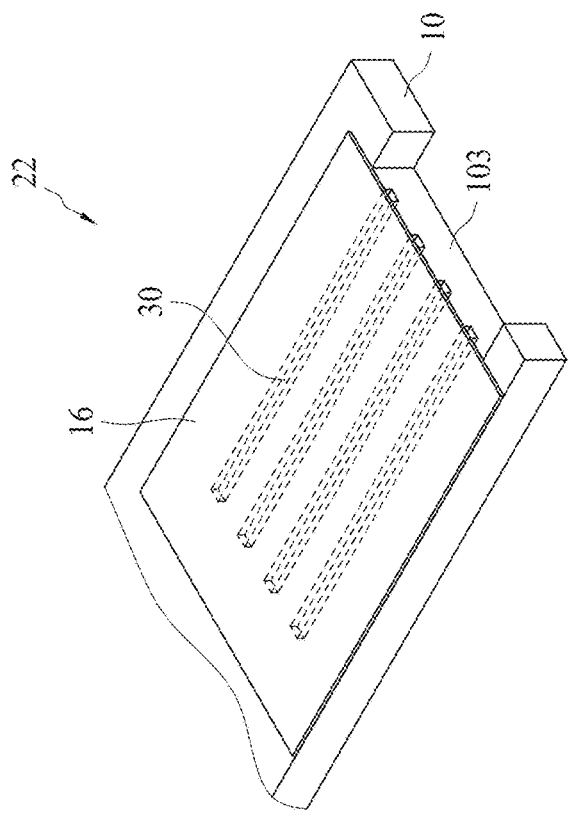

FIGS. 5C and 5D are side-sectional views of a semiconductor device (e.g., optical device 22) of FIG. 5B in accordance with some embodiments of the present disclosure. Referring to FIG. 5C, the optical devices 22 are separated by the backside grinding 92. The optical elements 30 are exposed by the first sidewall 103. The edges of the substrate 10 can be used to support or engage other suitable optical elements. Referring to FIG. 5D, the opening 220 of the substrate 10 can be used to support or engage other suitable inserted optical elements.

Figure 6A:
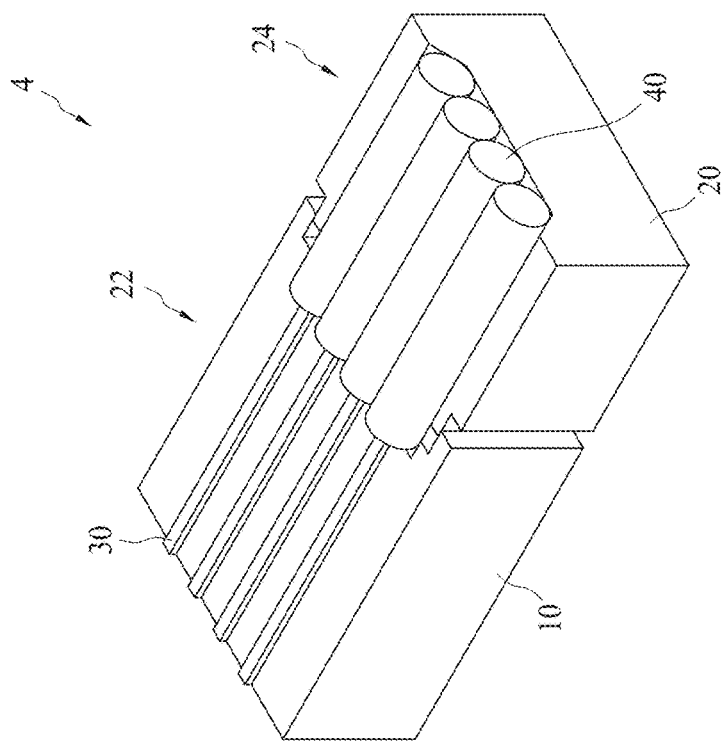
FIG. 6A and FIG. 6B are side-sectional views of a semiconductor device package in accordance with some embodiments of the present disclosure.
Figure 6B:
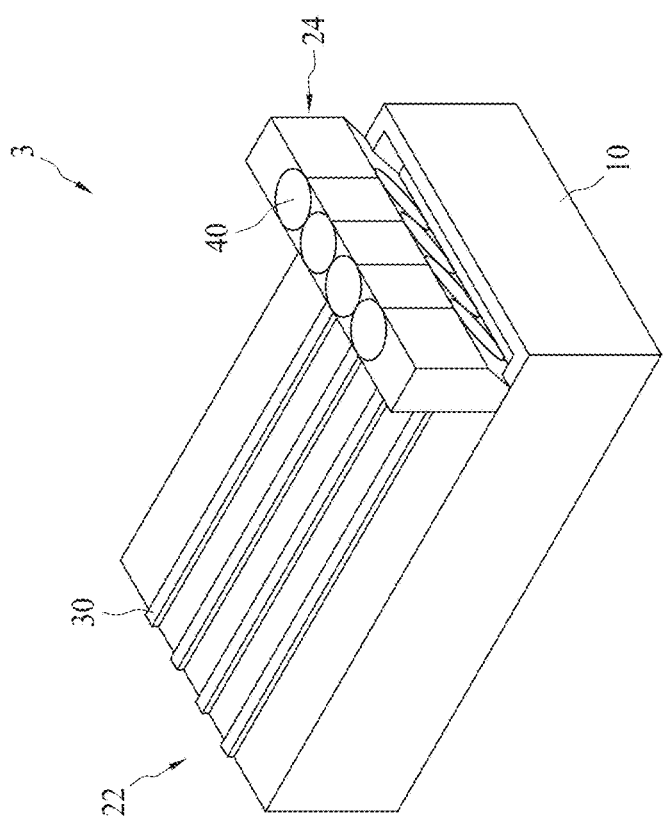

FIGS. 6A and 6B are side-sectional views of semiconductor device packages 3 and 4, respectively, in accordance with some embodiments of the present disclosure. Referring to FIG. 6A, the semiconductor device package 3 includes optical devices 22 and 24. The optical element 30 (e.g., waveguide) is precisely aligned with the optical element 40 by inserting the optical device 24 into the opening 220. Referring to FIG. 6B, the semiconductor device package 4 includes optical devices 22 and 24. The optical element 30 (e.g., waveguide) is precisely aligned with the optical element 40 by engaging the optical device 24.

As used herein, the terms "approximately" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For another example, a first angle may be approximately the same as a second angle if a difference between the first angle and the second angle is less than or equal to ±10°, such as ±5°, ±4°, ±3°, ±2°, ±1°, ±0.5°, ±0.1°, or ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device comprising:
    a substrate including a surface and a sidewall;
    a passivation layer on the surface; and
    an optical element in the substrate and exposed from the sidewall of the substrate,
    wherein the sidewall of the substrate is inclined such that the sidewall of the substrate and the surface of the substrate form an internal angle of approximately 87 degrees to approximately 89 degrees, and
    wherein the passivation layer comprises a curved sidewall adjacent to the sidewall of the substrate.

2. The semiconductor device of claim 1, wherein a thickness of the substrate is greater than about 400 micrometers (μm) and a thickness of the passivation layer is about 10 μm to about 15 μm.

3. The semiconductor device of claim 1, wherein the optical element further comprises a sidewall continuous with the sidewall of the substrate.

4. The semiconductor device of claim 1, wherein the optical element further comprises a sidewall substantially coplanar with the sidewall of the substrate.

5. The semiconductor device of claim 1, wherein the substrate further includes a protruding portion not covered by the passivation layer.

6. The semiconductor device of claim 1, wherein the optical element comprises a waveguide.

7. The semiconductor device of claim 1, wherein a roughness of the sidewall of the substrate is less than about 1.5 μm.

8. A semiconductor device package, comprising:
    a first optical device; and
    a second optical device,
    wherein the first optical device comprises:
        a first substrate including a first surface and a first sidewall;
        a passivation layer on the first surface of the first substrate; and
        a first optical element in the first substrate and exposed from the first sidewall of the first substrate, the first optical element comprising a sidewall,
    wherein the second optical device comprises:
        a second substrate including a second sidewall;
        a second optical element in the second substrate and exposed from the second sidewall of the second substrate, the second optical element comprising a sidewall, and
    wherein a lateral distance between the first sidewall of the first optical element of the first optical device and the second sidewall of the second optical element of the second optical device is less than about 2 micrometers (μm).

9. The semiconductor device package of claim 8, wherein the first sidewall of the first substrate is inclined such that the sidewall of the first substrate and the first surface of the first substrate form an internal angle of approximately 87 degrees to approximately 89 degrees.

10. The semiconductor device package of claim 8, wherein the passivation layer comprises a curved sidewall adjacent to the first sidewall of the first substrate.

11. The semiconductor device package of claim 8, wherein the first optical element of the first optical device comprises a waveguide.

12. The semiconductor device package of claim 8, wherein a thickness of the first optical element of the first optical device is less than about 10 μm.

13. The semiconductor device package of claim 8, wherein a roughness of the first sidewall of the first substrate of the first optical device is less than about 1.5 μm.

14. The semiconductor device package of claim 8, wherein a distance between an exposed portion of the first optical device and an exposed portion of the second optical device is less than about 2 μm.

15. The semiconductor device package of claim 8, wherein the second optical device includes a laser diode or an optical fiber optically coupled to the first optical element the first optical device.

16. The semiconductor device package of claim 8, wherein the second optical device is suspended on the second substrate.

17. The semiconductor device package of claim 8, wherein the second optical device is latched on the second substrate.

18. A semiconductor wafer comprising:
 a semiconductor body including a surface and a plurality of optical devices, wherein each of the plurality of optical devices includes a plurality of edges;
 a passivation layer disposed on each of the optical devices and on the surface of the semiconductor body; and
 a trench corresponding to each of the plurality of optical devices and recessed from the first surface of the semiconductor body,
 wherein the trench is adjacent to one of the plurality of edges of each of the optical devices.

19. The semiconductor wafer of claim 18, wherein the trench passes through the semiconductor body.

20. The semiconductor wafer of claim 18, wherein the trench penetrates through the semiconductor body.

21. The semiconductor wafer of claim 18, wherein the passivation layer comprises a curved sidewall.

22. The semiconductor wafer of claim 18, wherein a sidewall of each of the optical devices is exposed within the trench.

23. The semiconductor wafer of claim 18, wherein a warpage of the semiconductor body is about 5 μm to about 10 μm.

24. A semiconductor device, comprising:
 a substrate including a surface and a sidewall;
 a passivation layer on the surface; and
 an optical element in the substrate and exposed from the sidewall,
 wherein the passivation layer comprises a curved sidewall adjacent to the sidewall of the substrate.

25. The semiconductor device of claim 24, wherein the optical element further comprises a sidewall continuous with the sidewall of the substrate.

26. The semiconductor device of claim 24, wherein a roughness of the sidewall of the substrate is less than about 1.5 μm.

* * * * *